United States Patent
Morelle et al.

(10) Patent No.: US 8,444,913 B2
(45) Date of Patent: May 21, 2013

(54) METHOD OF ASSEMBLING A MEMBER ON A SUPPORT BY SINTERING A MASS OF CONDUCTIVE POWDER

(75) Inventors: Jean-Michel Morelle, Beaugency (FR); Laurent Vivet, Bois d'Arcy (FR); Mathieu Medina, Versailles (FR); Sandra Dimelli, Bois d'Arcy (FR)

(73) Assignee: Valeo Etudes Electroniques, Creteil (FR)

( * ) Notice: Subject to any disclaimer, the term of this patent is extended or adjusted under 35 U.S.C. 154(b) by 532 days.

(21) Appl. No.: 12/598,359

(22) PCT Filed: Apr. 23, 2008

(86) PCT No.: PCT/FR2008/050741
§ 371 (c)(1),
(2), (4) Date: Jan. 6, 2010

(87) PCT Pub. No.: WO2008/145930
PCT Pub. Date: Dec. 4, 2008

(65) Prior Publication Data
US 2010/0176098 A1 Jul. 15, 2010

(30) Foreign Application Priority Data
Apr. 30, 2007 (FR) .................... 07 54807

(51) Int. Cl.
*H01L 21/50* (2006.01)
*H01L 21/58* (2006.01)
(52) U.S. Cl.
USPC ............... 419/8; 419/23; 419/39; 438/122
(58) Field of Classification Search
USPC 219/121.63–121.66, 121.85; 148/24; 419/48, 419/49, 9, 8, 23, 38, 39; 264/109, 120; 228/248.1, 127, 194, 195, 228, 233.1, 134.1; 438/106, 121, 122; 257/712
See application file for complete search history.

(56) References Cited

U.S. PATENT DOCUMENTS
3,196,007 A * 7/1965 Wikle .............................. 419/28
3,934,073 A * 1/1976 Ardezzone .................... 174/549
(Continued)

FOREIGN PATENT DOCUMENTS
EP 0242626 A2 10/1987
EP 1599078 A2 11/2005

OTHER PUBLICATIONS
English Abstract of European Publication No. EP1599078, Nov. 23, 2005.
English Abstract of European Publication No. EP0242626, Jan. 10, 2008.
International Search Report of PCT/FR2008/050741; Oct. 31, 2008; Alessandra Corchia.
English Translation of Preliminary Search Report of French Application No. FR0754807; Jan. 10, 2008; Alessandra Corchia.

*Primary Examiner* — Samuel M Heinrich
(74) *Attorney, Agent, or Firm* — BCF LLP

(57) ABSTRACT

In this method, the conductive powder mass is placed on the support, and then the member is placed on the mass and a compression force is applied, urging the member against the mass and the support before heating the mass. The magnitude is increased from an initial value to a first predefined value for agglomerating the mass, which value is less than a plastic deformation threshold of the powder mass. Then, the magnitude is maintained at the first predefined value throughout a predetermined duration for agglomerating the powder mass. Finally, the magnitude is increased from the first value to a second predefined value less than a critical threshold for damaging the member but greater than a minimum threshold for sintering the mass at the predetermined temperature, the second predefined value being greater than the first predefined value.

11 Claims, 2 Drawing Sheets

U.S. PATENT DOCUMENTS

| | | |
|---|---|---|
| 4,281,236 A | 7/1981 | Von Allmen et al. |
| 5,039,294 A * | 8/1991 | Gautier et al. ............... 425/149 |
| 5,158,226 A | 10/1992 | Schwarzbauer |
| 2003/0102356 A1 | 6/2003 | Schwarzbauer |

* cited by examiner

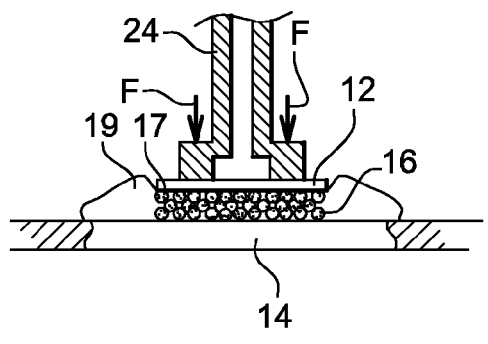
Fig. 4
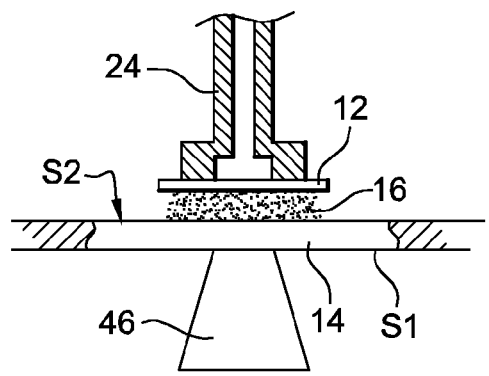
Fig. 5
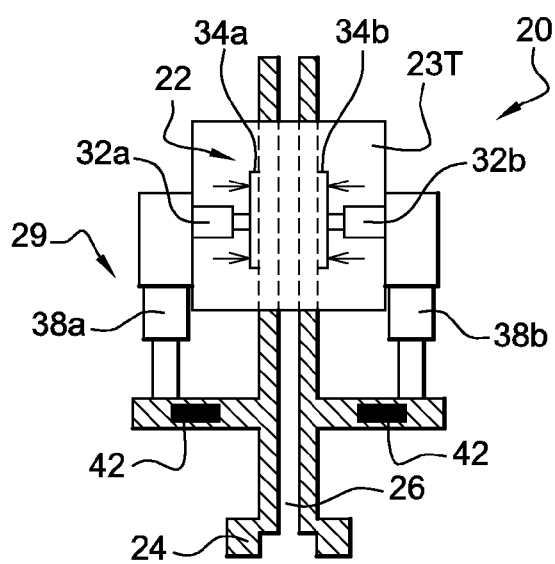
Fig. 6
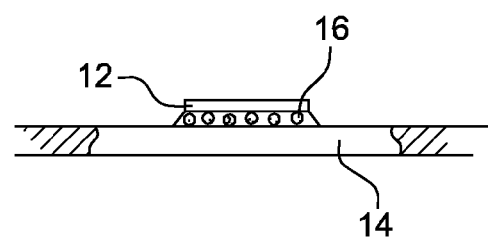

METHOD OF ASSEMBLING A MEMBER ON A SUPPORT BY SINTERING A MASS OF CONDUCTIVE POWDER

CROSS-REFERENCES

The present application is a national stage entry of International Application Number PCT/FR2008/050741, filed Apr. 23, 2008 which claims priority to French Patent Application No. 07 54807, filed Apr. 30, 2007, the entirety of both of which is incorporated herein by reference.

FIELD OF THE INVENTION

The present invention relates to a method of assembling a member on a support, and more particularly but not exclusively it relates to the technical field of electronics modules comprising a member that is to be assembled on a support for an application in a motor vehicle.

BACKGROUND OF THE INVENTION

An electronics module generally comprises a member mounted on a support by means of a joint that guarantees both mechanical and electrical connection of the member on the support.

Such electronics modules need to be adapted to withstand relatively high thermal stresses, the local temperature inside the motor vehicle, in particular in the engine compartment, being capable of reaching values much greater than 150° C.

In particular, the material forming the joint between the support and the member needs to have a melting point greater than the maximum temperatures to which the electronics module is subjected so as to avoid the support and the member coming apart while in use.

For example, a material essentially comprising silver is well suited since the melting point of silver is greater than 900° C.

In order to make such a joint, it is known in the state of the art, and in particular from US 2005/0247760, to implement a method of assembling an electronic component on a support by sintering a mass that comprises a mixture of conductive powder and of solvent.

During that assembly method, the solvent is removed from the mass by heating the mass so as to cause the solvent to evaporate.

Thereafter, the mass of powder is placed on a film that forms a temporary support and the chip is put into place on the mass. Thereafter, the chip and the mass are heated and a first compression force is applied thereto. The action of heat and the first compression force pre-sinters the powder mass and bonds the mass with the chip.

After separating the mass that is bonded to the chip from the temporary support, the mass bonded to the chip is placed on a final support. Thereafter, heat is applied, as is a second compression force urging the chip against the mass and the final support. The action of the heat and of the second compression force causes the powder mass to sinter and bonds the mass to the final support.

Thus, during that assembly method, the chip is subjected to two compression forces of relatively high magnitude, which runs the risk of damaging the chip.

Furthermore, because a compression force is applied twice urging the chip against the mass and only once urging the mass against the support, the mass may adhere to the chip more strongly than it does to the support. That unbalance can give rise to stresses within the powder mass, thereby weakening the bond between the chip and the support.

OBJECT AND SUMMARY OF THE INVENTION

A particular object of the invention is to provide a method of assembling a member on a support by sintering, which method enables a strong bond to be ensured between the member and the support, while preserving the integrity of the member during assembly, and doing so in relatively simple manner.

To this end, the invention provides a method of assembling a member on a support by sintering a mass of conductive powder to form a joint between the member and the support, in which the mass is heated to a predetermined temperature, wherein, prior to heating the mass, the following steps are performed:

placing the conductive powder mass on the support, and then the member on the mass;

applying a compression force urging the member against the mass and the support, and causing the magnitude of the compression force to be vary in such a manner that:

the magnitude is increased from an initial value to a first predefined value for agglomerating the mass, which value is less than a plastic deformation threshold of the powder mass;

maintaining the magnitude at the first predefined value throughout a predetermined duration for agglomerating the powder mass; and increasing the magnitude from the first value to a second predefined value less than a critical threshold for damaging the member but greater than a minimum threshold for sintering the mass at the predetermined temperature, the second predefined value being greater than the first predefined value.

When the magnitude of the compression force reaches the first predefined value, the powder mass is shaped by the powder particles becoming agglomerated with one another. Thus, the powder particles of the mass are put into contact with one another under the effect of the compression force throughout the predetermined duration for agglomeration. The first predefined value for the magnitude of the compression force is selected to be below a threshold for plastic deformation of the mass, thereby avoiding any sudden collapse of the mass on the support under the effect of the compression force while the particles are still too dispersed.

In particular, for a mass that comprises a mixture of powder and solvent, the first predefined value is such that compression of the member against the mass and the support serves to expel the solvent over the sides of the member without requiring any prior heating of the mass.

Increasing the magnitude of the compression force from the first value to the second value serves to optimize the contact surfaces firstly between the mass and the member and secondly between the mass and the support by flattening said contact surfaces, thereby ensuring good heat transfer between the elements of the module while the mass is being heated.

Furthermore, the second value is selected in such a manner that for the predetermined temperature for heating the mass, the compression on the mass is such that the powder particles forming the mass coalesce, i.e. the sintering operation is initiated.

Furthermore, progressively increasing the compression force and selecting the magnitudes of the compression forces to have values below the critical value for damaging the member serve to preserve the integrity thereof.

The assembly method of the invention may also include the following characteristics:

the magnitude of the compression force is maintained at the second predefined value at least during the predetermined duration for heating the mass;

a laser beam is directed against a first face of the support opposite from a second face of the support carrying the mass, the beam being directed at said mass for a period for irradiating the support with the beam that corresponds substantially to the predetermined heating duration;

the member is a semiconductor chip;

the conductive powder mass essentially comprises silver;

in order to put the powder mass into place on the support, the powder is dusted onto the support;

the predetermined temperature is less than the melting temperature of the powder mass;

while placing the member on the mass, the member is moved towards the mass until a contact position is detected between the member and the mass, and on detecting the contact position, the initial value of the magnitude of the compression force is set to a value that is substantially zero; and the powder mass comprises a mixture of conductive powder and of organic solvent.

BRIEF DESCRIPTION OF THE DRAWINGS

The invention can be better understood on reading the following description given purely by way of example and made with reference to the drawings, in which:

FIGS. 2 to 6 are face views of the arrangement device of FIG. 1, showing various steps in the assembly method of the invention.

MORE DETAILED DESCRIPTION

Figure 1:
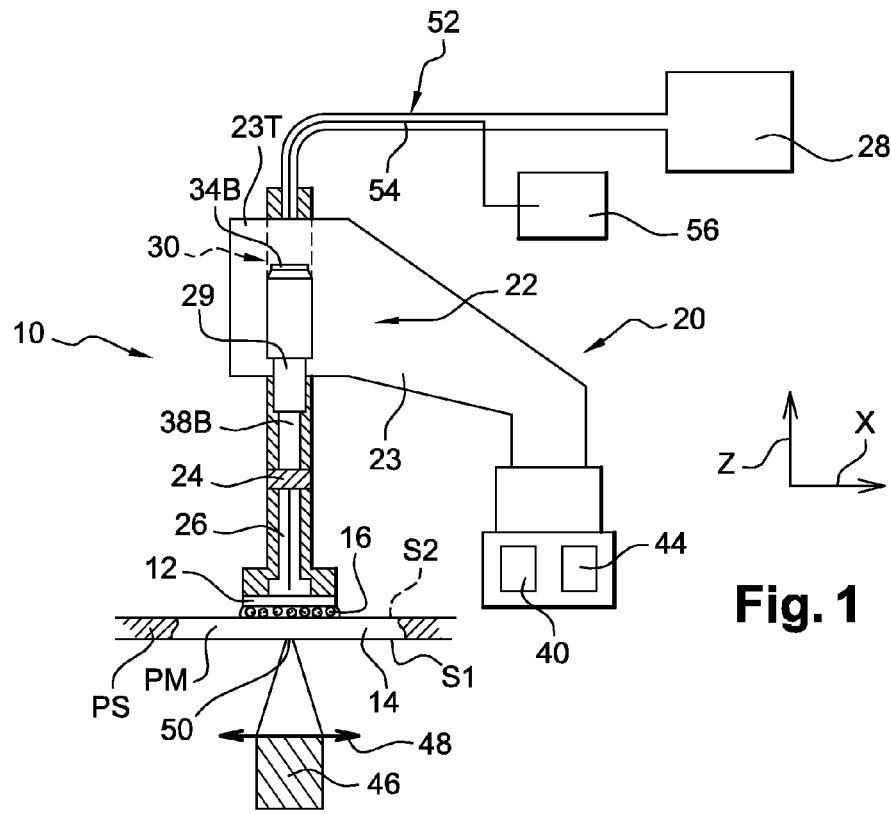
FIG. 1 is a diagram of an assembly installation for assembling a member on a support, the installation including an arrangement device for implementing an assembly method of the invention.

FIG. 1 shows an installation given overall reference 10. The installation 10 enables a member 12 to be assembled on a support 14 by sintering a joint-forming mass 16. In the example described, the member 12 is a semiconductor chip of conventional type. By way of example, the mass 16 is in the form of a conductive powder. Preferably, the conductive powder mass is essentially constituted by silver. In the example shown in FIG. 4, the mass 16 comprises a mixture of a conductive powder 17 and of a solvent 19.

In the example described, the support 14 comprises a metal portion PM, in particular made of copper, partially surrounded by a portion PS made of synthetic material forming a portion of a package for protecting the semiconductor chip 12 carried by the support 14.

The support 14 has first and second opposite faces S1 and S2. The mass 16 is designed to be carried by the second face S2 of the metal portion PM of the support. The second face S2 is preferably covered in a fine layer of nickel.

In order to arrange the chip 12 and the mass 16 on the support 14, the assembly installation 10 has movement means 20 for moving the chip 12 or the mass 16. These movement means 20 comprise hinged means 22 enabling the chip 12 or the mass 16 to be moved in a horizontal plane substantially parallel to axes X and Y, and in a vertical direction substantially parallel to an axis Z.

Preferably, the hinged means 22 comprise an arm having a head 23T carrying gripper means 24 for gripping the chip 12 or the mass 16.

By way of example, the gripper means 24 are of the suction type. Thus, the gripper means 24 comprise a suction duct 26 connected to suction means 28, e.g. including a vacuum pump.

The gripper means 24 are connected to the head 23T by means 29 for compressing a first element, constituted in particular by the chip 12 or the mass 16, against a second element, constituted in particular by the support 14. These compression means 29 enable the gripper means 24 and the head 23T to move relative to each other substantially parallel to the axis Z.

Nevertheless, the gripper means 24 may be secured to the head 23T using releasable connector means 30 capable of adopting an active state (see FIG. 2) in which the means 24 are securely connected to the head 23T, and a rest state (see FIG. 3) in which the means 24 are free relative to the head 23T.

The releasable connection means 30 preferably comprise clamping means, e.g. comprising first and second linear actuators 32a and 32b carried by the head 23T and suitable for acting horizontally (in this example parallel to the axis Y). These first and second actuators 32a and 32b carry respective first and second clamping jaws 34a and 34b (FIGS. 2 to 6). For example, the actuators 32a and 32b are of the pneumatic linear cylinder type having piston rods. Each jaw 34a or 34b is carried by a rod of the corresponding actuator 32a, 32b.

In the example described, when the releasable connector means 30 are in the active state, the jaws 34a and 34b engage the gripper means 24, and when the releasable connector means 30 are in the rest state, the clamping jaws 34a and 34b are spaced apart from the gripper means 24.

By way of example, the compression means 29 comprise first and second linear actuators 38a and 38b connecting the head 23T to the gripper means 24, the actuators acting vertically (parallel to the axis Z in this example). The actuators 38a and 38b serve to apply a vertical compression force urging the first element against the second element by exerting vertical thrust on the gripper means 24.

By way of example, the actuators 38a and 38b are pneumatic linear cylinder type actuators having piston rods, like the actuators 32a and 32b.

The magnitude of the compression force is adjusted by conventional adjustment means 40 shown in FIG. 1.

The installation 10 also includes detector means 42 for detecting a contact position of the first element on the second element. The detector means 42 preferably comprise a pressure sensor incorporated in the gripper means 24.

In a variant, the detector means 42 comprise a contact detector of the capacitive type.

The installation 10 also has means (not shown) acting as a counterweight relative to the movement means 20, and more particularly relative to the gripper means 24.

The installation 10 also includes control means 44 for controlling the compression means 29. These means 44 also serve to control the counterweight-forming means as a function of whether or not the means 42 detect the contact position.

In order to heat the mass 16 so as to cause said mass 16 to sinter, the installation 10 also has a source of heat, such as a laser source emitting a beam 46, for example.

The installation 10 also has means 48 for focusing the laser beam 46 at a point 50 in register with the solder-forming mass 16.

Optionally, in order to monitor the temperature of the mass 16 and of the chip 12 during heating, the movement means 20 include infrared type temperature measurement means 52 (see FIG. 1).

For example, the measurement means 52 comprise an optical fiber 54 extending in the suction duct 26 of the gripper means 24. Optionally, the measurement means 52 also comprise an infrared pyrometer 56 connected to the optical fiber 54.

The principal steps of an assembly method of the invention are described below with reference to FIGS. 2 to 6.

Firstly, the member 12 and the mass 16 are arranged on the support 14 as follows.

The movement means 20 are used for this purpose with the releasable connector means 30 therein initially being active. While in this state, the clamping jaws 34a and 34b engage the gripper means 24 so that these gripper means 24 are secured to the head 23T of the hinged means 22. No compression force is applied to the mass 16 because the means 30 are active.

During a first step, the mass 16 is placed on the support 14. Thus, during this first step, the suction means 52 are initially activated so that the mass 16 is held by the gripper means 24. The mass 16 is then moved towards the support 14 by the means 20. The movement of the gripper means 24 is relatively precise since it is associated directly with the movement of the hinged means 22.

Figure 2:
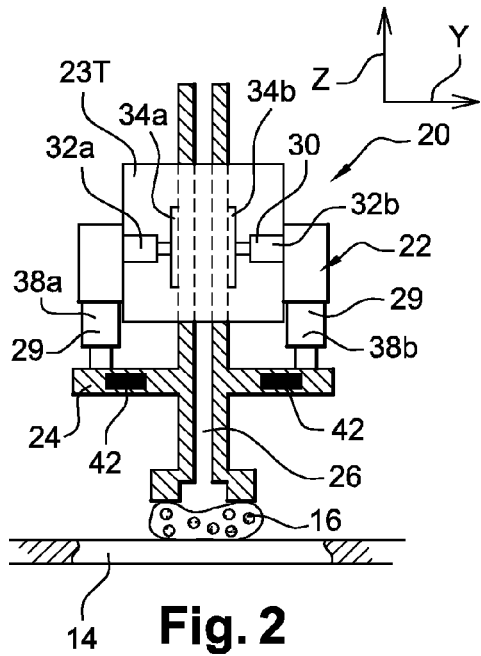
Figure 3:
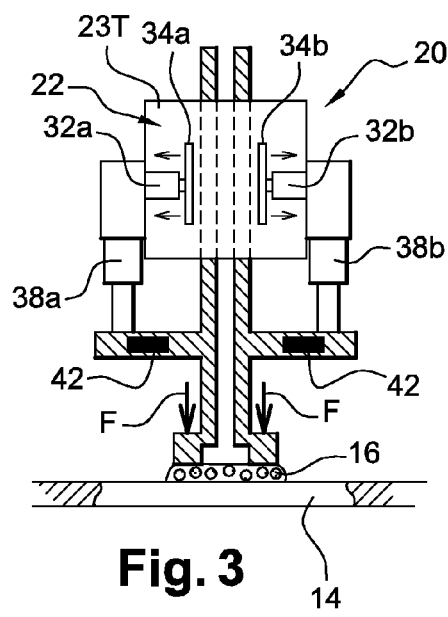

As soon as the contact position between the mass 16 and the surface S2 of the support 14 is detected, the suction means 52 are deactivated such that the gripper means 24 release the mass 16 (FIG. 2). The mass 16 has an initial shape that is generally relatively irregular. For example, the mass 16 has a thickness of about 100 micrometers ($\mu$m).

In a variant that is not shown, in order to put the mass into place on the support, powder is dusted onto the support.

During a second step, the semiconductor chip 12 is put into place on the mass 16. The movement means 20 take hold of the chip 12 by suction and move the chip 12 towards the mass 16.

As soon as a contact position between the chip 12 and the mass 16 is detected, the movement means 20 stop moving.

The connector means 30 then take on the rest state in which the jaws are spaced apart from the gripper means 24.

During a third step, the means 44 control the compression means 29 as follows. In particular for the purpose of reducing irregularities firstly at the contact surface between the chip 12 and the mass 16 and secondly at the contact surface between the mass 16 and the support 14, and in order to put the grains of powder 17 into contact with one another, a compression force F is applied by the means 29 to the chip 12 so as to urge the chip 12 against the mass 16 and the support 14. The magnitude of the force F is caused to vary.

During an initial stage of variation, the magnitude of the force F is increased to a first predefined value for agglomerating the mass 16. This first value is selected to be below a plastic deformation threshold of the powder mass 16. For example, the first predefined value is about 10 grams force.

Preferably, in order to monitor accurately the magnitude of the compression force F, as soon as the contact position is detected between the chip 12 and the mass 16, the means 44 also activate the counterweight-forming means for countering the weight of the gripper means 24. Activating the counterweight-forming means and adjusting the value of the magnitude of the force by the adjustment means 40 enable the initial value of the magnitude of the force to be adjusted to a value that is substantially zero.

Thus, on detecting the contact position between the chip 12 and the mass 16, the initial value of the magnitude of the compression force is set to a value that is substantially zero.

Thereafter, the magnitude of the force F is increased from its initial value substantially equal to zero, as set during detection of the contact position, to the first predefined value for agglomerating the mass 16.

Preferably, the magnitude of the compression force is increased in incremental steps of the magnitude up to the first predefined value.

In a second variation stage, the magnitude of the force F is maintained at the first predefined value for a predetermined duration for agglomerating the mass of powder 16. The predetermined duration for agglomerating the powder may be 500 milliseconds (ms) for example.

For this purpose, the gripper means 24 move progressively downwards under drive from the rods being extended from the actuators 38a and 38b so as to maintain the magnitude of the compression force constant and equal to the first predefined value throughout the predetermined duration for agglomerating the grains of the powder 17.

As can be seen in FIG. 4, applying the compression force F urging the chip 12 against the mass 16 and the support 14, with a magnitude that is equal to the first predefined value, serves firstly to cause the solvent 19 to flow out over the sides of the chip 12, and secondly causes the grains of powder 17 to become agglomerated with one another.

In a third variation stage, the magnitude of the force F is increased from the first value to a second predefined value below a critical threshold for damaging the member, but higher than a minimum threshold for sintering the mass 16 at the predetermined temperature. The second predefined value is greater than the first predefined value.

Thus, the magnitude of the force F is increased up to a second predefined value greater than the first predefined value. For example, the second predefined value is 100 grams force.

After the member 12 and the mass 16 have been arranged on the support 14 as described above, the mass 16 is heated to a predetermined temperature for a predetermined duration. For this purpose, the laser beam 46 is directed against the first face S1 of the support (see FIG. 5). More precisely, the laser beam 46 is directed at the mass 16 during a period for irradiating the support 14 with the beam 46. This irradiation period corresponds substantially to the predetermined duration for heating the mass.

During this irradiation period, the compression means 29 are controlled so as to maintain the value of the magnitude of the force F at the second predefined value throughout the predetermined duration for heating the mass. For this purpose, the gripper means 24 move progressively downwards under drive from the piston rods being extended from the actuators 38a and 38b so as to maintain the magnitude of the compression force constant and equal to the second predefined value throughout the predetermined duration for heating the mass.

The heat generated at the point 50 where the support 14 is irradiated by the laser beam 46 propagates within the support 14 until it reaches the mass 16 and the chip 12. The mass 16 is then heated to a predetermined temperature.

Because the surface irregularities were attenuated while the chip 12 was being compressed against the mass 16 and the support 14, heat transfer between the support 14 and the mass 16 and also between the mass 16 and the chip 12 is relatively good.

Furthermore, the predetermined temperature and the magnitude of the compression force are selected so as to cause the mass 16 to sinter and thus bond the mass 16 to the chip 12 and also the mass 16 to the support 14.

The predetermined temperature is always lower than the melting point for the grains of silver powder that constitute the mass 16. The heating temperature has a value lying for example in the range from a minimum value of 200° C. to a maximum value of 400° C., the maximum value corresponding to a critical threshold of the chip for withstanding temperature.

At this predetermined temperature, the second predefined value is greater than the threshold for plastic deformation of the powder mass 16, such that sintering of the powder mass is initiated.

During irradiation of the support 14 by the laser beam 46 and during cooling of the mass 16, it is possible to monitor the temperature, in particular of the chip 12, by using the measurement means 52. The optical fiber 54 collects the infrared flux emitted by the chip 12 and conveys it to the pyrometer 56. The pyrometer 56 then converts the collected light flux into a temperature value.

After the mass 16 has cooled, the suction means 28 are deactivated and the gripper means 24 release the chip 12, as shown in FIG. 6. The means 44 cause the compression means 29 to be deactivated, and the releasable connector means 30 pass from the active state to the rest state so that the gripper means 24 are again securely connected to the head 23T and the means 20 move the gripper means 24, e.g. to arrange and assemble a new element on the support 14.

By means of the assembly method, the magnitude of the compression force applied to the chip, to the mass, and to the support is made to be uniform while the elements are being assembled together. Furthermore, because a compression force is initially applied of magnitude that is relatively small and equal to the first predefined value less than the plastic deformation threshold, and because this magnitude is maintained during a predetermined duration for agglomerating the powder grains, the grains of powder 17 form a coherent mass at the end of the predetermined agglomeration duration. The values of the predetermined temperature and of the magnitude of the compression force needed for sintering the mass can then be optimized. Thus, applying the compression force in two stages makes it possible to form a joint of uniform quality between the support and the chip.

What is claimed is:

1. A method of assembling a member on a support by sintering a mass of conductive powder to form a joint between the member and the support, in which the mass is heated to a predetermined temperature, wherein, prior to heating the mass, the following steps are performed:

placing the conductive powder mass on the support, and then the member on the mass;

applying a compression force urging the member against the mass and the support, and causing the magnitude of the compression force to be varied in such a manner that:

the magnitude is increased from an initial value to a first predefined value for agglomerating the mass, which value is less than a plastic deformation threshold of the powder mass;

maintaining the magnitude at the first predefined value throughout a predetermined duration for agglomerating the powder mass; and increasing the magnitude from the first value to a second predefined value less than a critical threshold for damaging the member but greater than a minimum threshold for sintering the mass at the predetermined temperature, the second predefined value being greater than the first predefined value.

2. The assembly method according to claim 1, wherein the magnitude of the compression force is maintained at the second predefined value at least during the predetermined duration for heating the mass.

3. The assembly method according to claim 2, wherein a laser beam is directed against a first face of the support opposite from a second face of the support carrying the mass, the beam being directed at said mass for a period for irradiating the support with the beam that corresponds substantially to the predetermined heating duration.

4. The assembly method according to claim 1, wherein the member is a semiconductor chip.

5. The assembly method according to claim 1, wherein the conductive powder mass essentially comprises silver.

6. The assembly method according to claim 1, wherein, in order to put the powder mass into place on the support, the powder is dusted onto the support.

7. The assembly method according to claim 1, wherein the predetermined temperature is less than the melting temperature of the powder mass.

8. The assembly method according to claim 1, wherein, while placing the member on the mass, the member is moved towards the mass until a contact position is detected between the member and the mass, and on detecting the contact position, the initial value of the magnitude of the compression force is set to a value that is substantially zero.

9. The assembly method according to claim 1, wherein the powder mass comprises a mixture of conductive powder and of organic solvent.

10. The assembly method according to claim 1, wherein said predetermined temperature ranges from a minimum value of 200° C. to a maximum value of 400° C.

11. The assembly method according to claim 1, wherein said steps of increasing said magnitude from the initial value to the first predefined value, maintaining said magnitude and increasing said magnitude from a first value to a second value are carried out without interruptions.

* * * * *